United States Patent
Wu

(10) Patent No.: US 6,531,387 B1
(45) Date of Patent: Mar. 11, 2003

(54) POLISHING OF CONDUCTIVE LAYERS IN FABRICATION OF INTEGRATED CIRCUITS

(75) Inventor: Kuo-Chun Wu, San Jose, CA (US)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 10/174,431

(22) Filed: Jun. 17, 2002

(51) Int. Cl.[7] .......................................... H01L 21/4763
(52) U.S. Cl. ....................... 438/633; 438/626; 438/631; 438/645; 438/672; 438/692
(58) Field of Search ................. 438/626, 631, 438/633, 645, 672, 692

(56) References Cited

U.S. PATENT DOCUMENTS

| | | | |
|---|---|---|---|
| 5,723,874 A | * 3/1998 | Baker et al. | 257/48 |
| 5,874,318 A | 2/1999 | Baker et al. | 438/8 |
| 5,972,798 A | * 10/1999 | Jang et al. | 438/692 |
| 6,087,733 A | * 7/2000 | Maxim et al. | 257/797 |
| 6,292,265 B1 | 9/2001 | Finarov et al. | 356/630 |
| 6,300,248 B1 | * 10/2001 | Lin et al. | 438/692 |
| 6,340,602 B1 | 1/2002 | Johnson et al. | 438/7 |
| 6,472,291 B1 | * 10/2002 | Page et al. | 438/692 |
| 6,486,066 B2 | * 11/2002 | Cleeves et al. | 438/692 |
| 2001/0015811 A1 | 8/2001 | Ravid et al. | 356/600 |
| 2001/0047682 A1 | 12/2001 | Samsavar et al. | 73/105 |
| 2002/0106837 A1 | * 8/2002 | Cleeves et al. | 438/633 |

* cited by examiner

*Primary Examiner*—John F. Niebling
*Assistant Examiner*—Lynne A Gurley
(74) *Attorney, Agent, or Firm*—Skjerven Morrill LLP; Michael Shenker

(57) ABSTRACT

In fabrication of integrated circuits, trenches (184) are formed in a dielectric (170), then a metal (e.g. tungsten or copper) is deposited. The metal (194) is removed from the top surface of the dielectric by a polishing process (e.g. CMP). The metal remains in the trenches. The inventor has discovered that the erosion of the structure in the polishing process does not strongly depend on the size of the structure. Therefore, the erosion of a large structure (440) can be estimated by measuring the erosion of a smaller test structure (450). The erosion of the test structure is measured by a probe instrument (230), e.g. a stylus profilometer or a scanning probe microscope. Use of the test structure reduces the probability of damaging the larger structure by the probe. Other embodiments are also provided.

18 Claims, 3 Drawing Sheets

POLISHING OF CONDUCTIVE LAYERS IN FABRICATION OF INTEGRATED CIRCUITS

BACKGROUND OF THE INVENTION

The present invention relates to mechanical or chemical mechanical polishing of conductive layers.

Chemical mechanical polishing (CMP) have been used to pattern metal layers in fabrication of semiconductor integrated circuits. FIGS. 1 and 2 illustrate cross sections of a wafer in one fabrication process. The fabrication starts with a semiconductor substrate 120. MOS transistor source/drain regions 130 are formed in substrate 120, and a transistor gate 140 is formed over a channel region extending between the source/drain regions. (Other circuit elements may also be present.) A dielectric 150 is formed over the substrate 120 and patterned as needed. A conductive layer 160 (e.g. aluminum) is formed on dielectric 150 and suitably patterned. A dielectric 170 is formed on layer 160. Trenches 184 are etched in dielectric 170 to define interconnect lines. Vias 190 are etched at the bottom of the trenches at selected locations to expose the layer 160. Then a metal layer 194 (tungsten or copper) is deposited over the structure, filling the trenches 184 and the vias 190.

The wafer is polished by CMP (FIG. 2) until the metal 194 is removed from the top surface of dielectric 170. Trenches 184 and vias 190 remain filled with metal 194, providing the interconnect lines contacting the layer 160 in vias 190.

To ensure complete removal of metal 194 from the top surface of dielectric 170, the wafer is overpolished, i.e. the polishing continues for some time after the dielectric 170 is exposed. When the dielectric has been exposed, the polishing proceeds faster in a region 210 having a high density of metal lines 194, than in a surrounding region 220 having no metal lines. Consequently, the top surface of region 210 is indented ("eroded"). The erosion undesirably changes the electrical properties of interconnect lines 194. Also, the top surface of the wafer becomes non-planar, which complicates fabrication of overlying layers. See U.S. Pat. No. 6,340,602 issued Jan. 22, 2002 to Johnson et al. and incorporated herein by reference.

In order to ensure that the erosion does not exceed some acceptable limit, the polished wafers are examined to determine the maximum erosion value $\Delta$. If $\Delta$ exceeds the limit, the wafer is discarded. Also, if $\Delta$ approaches or exceeds the limit, the CMP process is adjusted to reduced the erosion in subsequent wafers.

The maximum erosion $\Delta$ can be measured with a probe tool 230, e.g. a stylus profilometer or a scanning probe microscope (e.g. atomic force microscope). Tool 230 has a probe 240, a circuitry 250 for processing the data from the probe, and a mechanism (not shown) for moving the probe relative to the wafer. See e.g. U.S. patent application Ser. No. 2001/0047682 published Dec. 6, 2001. Probe 240 contacts the wafer top surface, or comes very close to the wafer to sense the top surface topography. Undesirably, the wafer can be contaminated by the probe. Therefore, more expensive and complicated optical instruments have been used instead of the probe instruments to measure the erosion in production wafers.

SUMMARY

The invention is defined by the appended claims which are incorporated into this section by reference. This section summarizes below some features of the invention.

Some embodiments of the invention make it safer to use a probe for the erosion measurements on production wafers. This will now be illustrated with reference to FIG. 3, showing the top view of a polished wafer. In this example, trenches 184 and metal lines 194 form a periodic pattern in region 210. The pattern has a pitch P defined as a distance between similar points on the adjacent metal lines. P=W+S, where W is the width of each metal line and S is the distance between the adjacent lines 194. It is well known that the erosion increases with the W/P ratio.

The inventor has studied the dependence of the erosion on the size of regions 210, and has discovered that if the W and S parameters are held constant, then the size dependence is weak. Consequently, the erosion in a large region 210 can be estimated by measuring the erosion of a smaller test structure. For example, a test structure of 50×50 $\mu$m can be incorporated into the wafer and used to monitor the erosion in a region 210 having dimensions on the order of several millimeters (e.g. the lines 194 can be bitlines or strap lines of a memory array). The erosion of the test structure can be measured with a probe tool 230 since damage to the test structure is acceptable. The probe may contact the wafer, or come as close as 2 $\mu$m to the wafer, or as close as 1 $\mu$m, or closer. A test structure of 50×50 $\mu$m can be formed on a scribe line or a margin of the wafer.

In some embodiments, the test structure has the same layers (e.g. 150, 160, etc.) as the actual circuitry region 210 In other embodiments, some layers (e.g. 140 or 160) are omitted in the test structure. Also, the test structure may have additional layers.

The invention is not limited to the embodiments described above. The invention is not limited to rectangular regions 210 or periodic structures. For non-periodic structures, the pitch P is defined as the distance between the corresponding points on the adjacent metal lines (e.g. between the left edges of the adjacent lines), and the pitch P may vary over the structure. Also, the invention is not limited to use of a probe to measure the erosion. Some aspects of the invention consist in the presence of certain structures on the wafer and are not limited to the use of a probe. The erosion of the wafers with such structures can be measured with optical instruments without a probe. Other features of the invention are described below. The invention is defined by the appended claims.

DESCRIPTION OF SOME EMBODIMENTS

The examples in this section are provided for illustration and not to limit the invention. The invention is not limited to particular circuitry, layers, materials, processes, process parameters, equipment, or dimensions.

Figure 4:
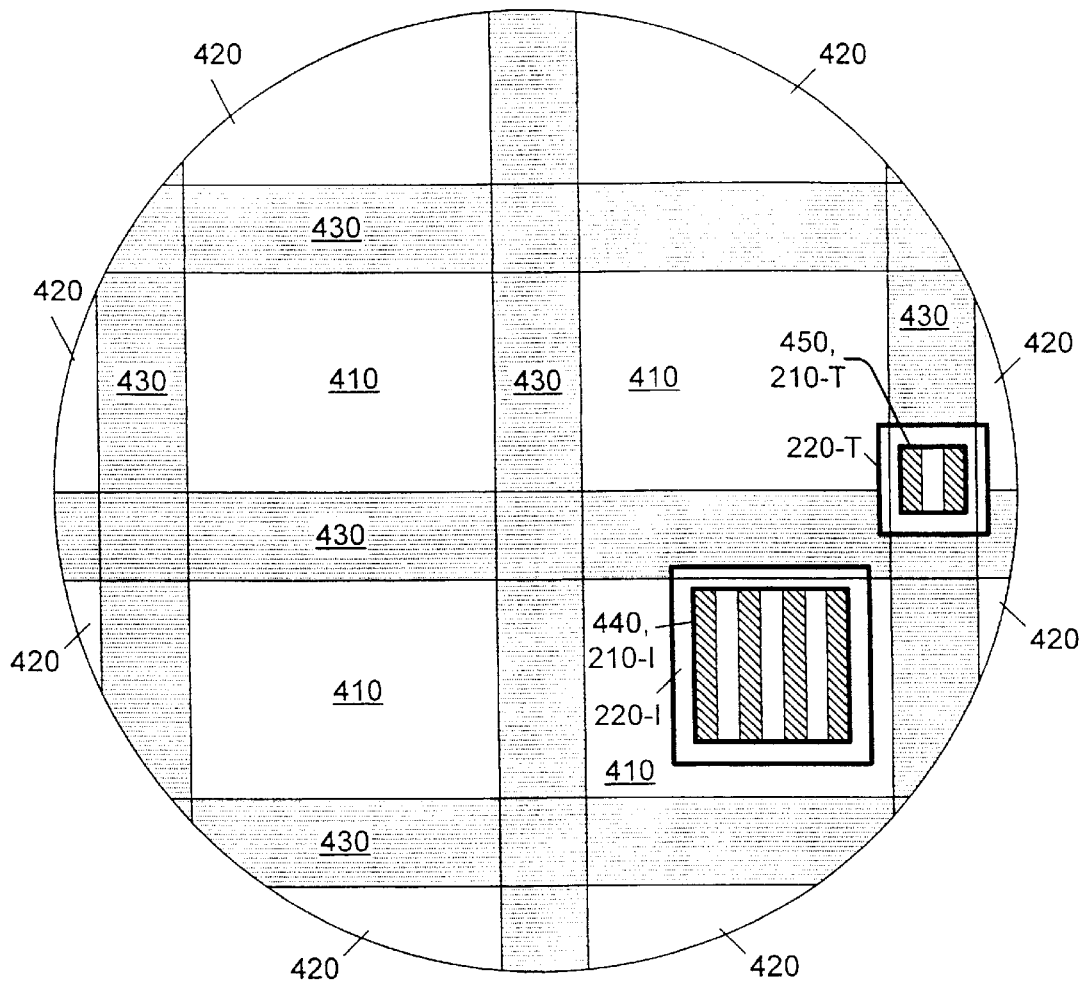
FIGS. 4 and 5 are plan views of wafers processed according to some embodiments of the present invention.

FIG. 4 is a top view of a wafer processed according to one embodiment of the present invention. The wafer includes a number of die areas 410 and margin areas 420 separated by scribe lines 430. Integrated circuits are being manufactured in die areas 410. The wafer will be diced along scribe lines 430, and the margins 420 will be discarded.

Figure 1:
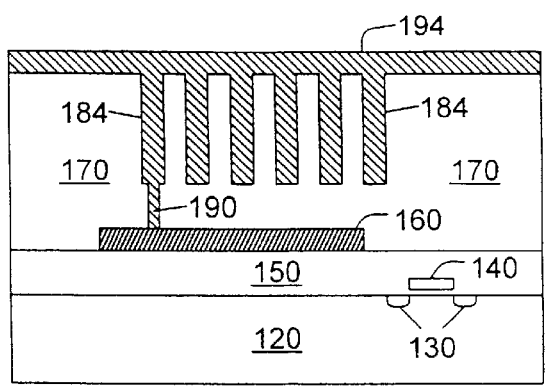
FIGS. 1 and 2 are cross section illustrations of a wafer in the process of integrated circuit fabrication.
Figure 2:
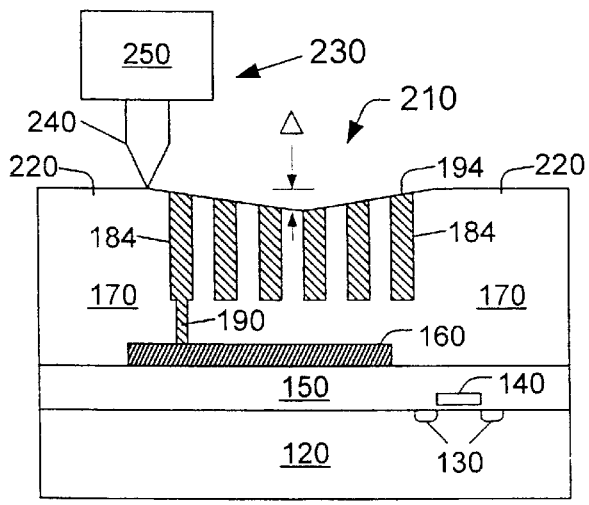
Figure 3:
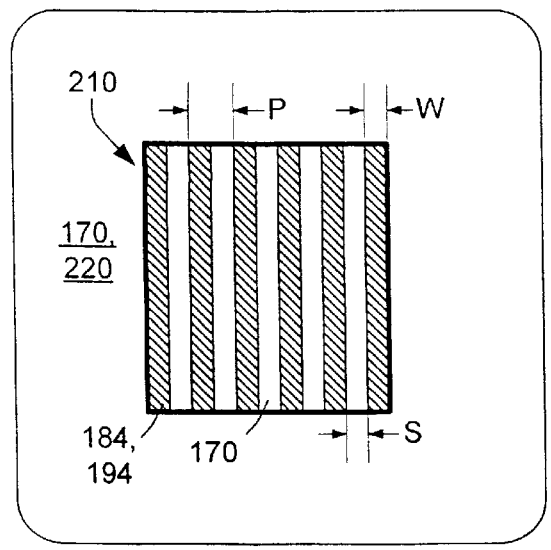
FIG. 3 is a plan view of the wafer of FIGS. 1 and 2.

Interconnect structures 440 and a test structure 450 have been formed in the wafer by the process of FIGS. 1–3. Only one structure 440 is shown, but many such structures can be present. Interconnect structures 440 are located in die areas 410, and they will be part of functional circuitry when the integrated circuit fabrication is completed. (The functional circuitry may be circuitry used in normal operation or may be test circuitry used for electrical testing of other circuits in the wafer.) Test structure 450 can be located on the scribe lines and/or in the margin areas. Each structure 440, 450 may have a cross sectional view as in FIG. 2. For example, each structure 440, 450 may have a dielectric region 170 having trenches 184 etched therein. Metal lines 194 fill the trenches. Each interconnect structure 440 occupies a region 210-I which corresponds to region 210 in FIG. 2. Each structure 440 is surrounded by a region 220-I which corresponds to region 220. In a similar manner; test structure 450 occupies a region 210-T and is surrounded by a region 220-T. Regions 220-I, 220-T are regions of dielectric 170. Metal 194 is absent from these regions. Alternatively, metal 194 may be present in these regions, but the density of metal 194 (the ratio of the area occupied by metal 194 to the total area of the region) is low and does not to have a significant effect on the CMP polishing rate. In some embodiments, the density of metal 194 in regions 220-I, 220-T is at most 10%.

In some embodiments, the structures 440, 450 are periodic, and the pitch P and the dimensions W, S in test structure 450 are the same as in structures 440. In other embodiments, the structures 440, 450 are not periodic, and the maximum value of the pitch P over test structure 450 is the same as over the structures 440. Test structure 450 is smaller than each structure 440. In some embodiments, each test structure is about 50×50 $\mu$m, and each structure 440 is at least 200×200 $\mu$m. In some embodiments, each structure 440 is at least 1×1 mm. Regions 220-I, 220-T are each at least 50 $\mu$m wide. Regions 220-I surrounding different structures 440 may overlap with each other or with region 220-T. Also, regions 220-I may overlap scribe lines 430 or margins 420. Regions 220-T may overlap die areas 410. In some embodiments, the entire test structure 440 and its region 220T lie in a die area. The test structure is not used for functional circuitry.

Non-square and non-rectangular structures 450, 440 may be present. Also, a structure 450 may be rectangular while the structures 440 may be non-rectangular, and other variations and combinations of shapes are possible.

While only one test structure 450 is shown, multiple test structures can be used. The test structures can be located at different points to measure erosion at different parts of the wafer. Also, different interconnect structures 440 on the same wafer may have different P, W and S parameters, and the erosion in each interconnect structure 440 can be estimated with a test structure or structures 450 having the same P, W and S parameters as the interconnect structure.

In some embodiments, each test structure 450 is made with the same layers as the corresponding structures 440. In other embodiments, some of the features and layers are omitted from the test structure. In the example of FIG. 2, the MOS transistor or the layer 160 can be omitted from the test structure. In other embodiments, a test structure 450 may contain additional layers compared to the interconnect structures.

In illustrative embodiments, test wafers (non-production wafers) were manufactured with test structures 450 having a size of 50 $\mu$m×50 $\mu$m. Each interconnect structure 440 was 200 $\mu$m×200 $\mu$m. The structures 440, 450 were periodic structures. Trenches 184 were 250 nm deep. Dielectric 170 was silicon dioxide formed over monocrystalline silicon substrate 120 by plasma assisted chemical vapor deposition. Metal 194 was formed as follows. A titanium barrier layer was deposited to a thickness of 30 nm. Then a barrier layer of TiN was deposited to a thickness of 20 nm. Then tungsten was sputter deposited to a thickness of 550 m.

Metal 194 was polished with CMP. The polishing was performed in a system of type 472 available from IPEC, using a stacked pad of type IC1000/Suba IV, with a slurry of type SSW2585 available from Cabot Microelectronics Corporation of Aurora, Ill. 4% of hydrogen peroxide was added to the slurry. The slurry flow was 150 ml/min. The downward pressure was 6 psi, the platen speed 80 rpm, the wafer carrier speed 78 rmp.

The dimensions in structures 440, 450 were as follows:

| Pitch ($\mu$m) | Metal line width W ($\mu$m) | Density (P/W) |
| --- | --- | --- |
| 0.48 | 0.3 | 0.625 |
| 4 | 2.5 | 0.625 |
| 0.48 | 0.12 | 0.25 |
| 4 | 1.0 | 0.25 |

Erosion was measured in regions 440, 450 with a stylus profilometer of type P22 available from KLA-Tencor. The stylus 240 physically contacted the wafer in these regions. In each of the four cases, the same erosion values were obtained in structures 440 and 450.

Figure 5:
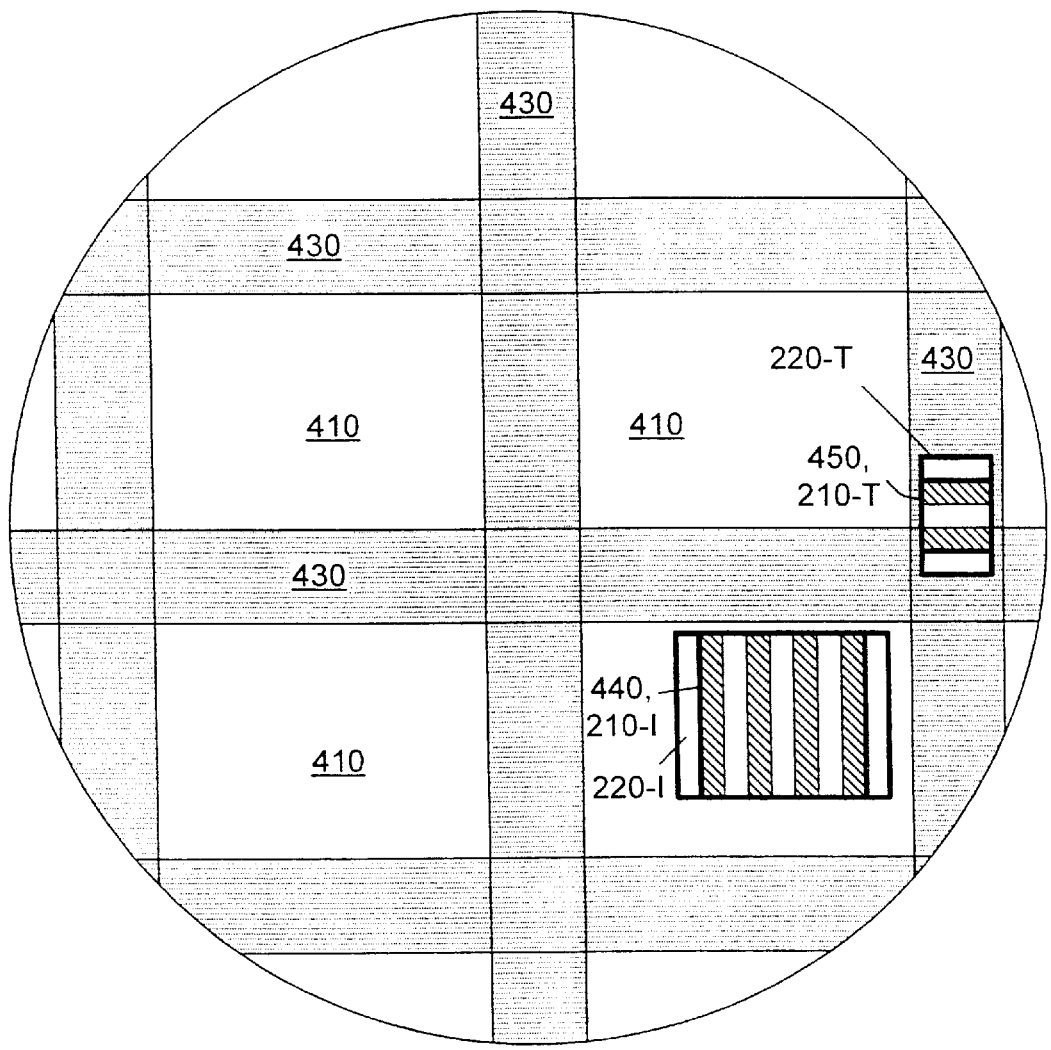

These dimensions are exemplary and not limiting. The invention is not limited by any particular layers, materials, circuits, dimensions, and process parameters. For example, metal 184 (FIG. 2) may contact the substrate 120 or some other layer. Also, the wafer does not have to be diced. Test structures can be incorporated into a wafer that does not have any scribe lines. Also, as shown in FIG. 5, the regions 220-I, 220-T can adjoin the respective structures 210-I, 210-T on only two opposite sides. The invention is applicable to purely mechanical (non-chemical) polishing. The invention is defined by the appended claims.

What is claimed is:

1. A method for fabricating an integrated circuit or circuits in a wafer, the method comprising polishing the wafer, wherein the wafer comprises (i) a semiconductor substrate, (ii) a dielectric formed over the semiconductor substrate, the dielectric having a plurality of trenches therein, and (iii) a conductive material formed on the dielectric and in the trenches;

wherein the polishing operation comprises polishing the conductive material to remove the conductive material from the top surface of the dielectric;

wherein the dielectric and the conductive material in the trenches form a first structure and a second structure spaced from the first structure, wherein each of the first and second structures have the same distance between corresponding points of adjacent trenches, wherein the first structure is adjoined on at least two opposite sides by first regions which do not have said conductive material or in which said conductive material has a lower density than in the first structure, and the second structure is adjoined on at least two opposite sides by second regions which do not have said conductive material or in which said conductive material has a lower density than in the second structure, wherein the second regions are disjoint from the first regions or overlap the first regions;

wherein the second structure is smaller in size than the first structure;

after the polishing operation, estimating an erosion in the first structure by measuring an erosion in the second structure with a probe that comes as close as 2 µm or closer to the wafer at the location of the second structure.

2. The method of claim 1 wherein the probe physically contacts the second structure during the erosion measuring operation.

3. The method of claim 1 wherein the method is applied to a plurality of wafers, wherein the method further comprises, after estimating the erosion for one of the wafers, adjusting the polishing process for the subsequently polished wafers if the measured or estimated erosion exceeds a predetermined value.

4. The method of claim 1 wherein the first structure is at least as large as a square of 1×1 mm, and the second structure is no larger than a square of 60×60 µm.

5. The method of claim 1 wherein the first and second structures are periodic structures, wherein the conductive material forms a plurality of conductive lines in each of the first and second structures, wherein the width of each conductive line and the distance between the adjacent conductive lines are the same in the first and second structures.

6. The method of claim 1 wherein at the location of the second structure the wafer does not have any layers not present in the first structure.

7. The method of claim 1 wherein the second structure overlaps a scribe line or a margin area of the wafer.

8. The method of claim 1 wherein the conductive material comprises metal.

9. The method of claim 1 wherein the conductive material comprises copper or tungsten.

10. A method for fabricating an integrated circuit or circuits in a wafer, the method comprising polishing the wafer, wherein the wafer comprises (i) a semiconductor substrate, (ii) a dielectric formed over the semiconductor substrate, the dielectric having a plurality of trenches therein, and (iii) a conductive material formed on the dielectric and in the trenches;

wherein the polishing operation comprises polishing the conductive material to remove the conductive material from the top surface of the dielectric;

wherein the dielectric and the conductive material in the trenches form a first structure and a second structure spaced from the first structure, wherein each of the first and second structures have the same distance between corresponding points of adjacent trenches, wherein the first structure is adjoined on at least two opposite sides by first regions which do not have said conductive material or in which said conductive material has a lower density than in the first structure, and the second structure is adjoined on at least two opposite sides by second regions which do not have said conductive material or in which said conductive material has a lower density than in the second structure, wherein the second regions are disjoint from the first regions or overlap the first regions;

wherein the second structure is smaller in size than the first structure, and the second structure is a test structure suitable for testing of the wafer but not forming part of any functional circuitry manufactured in the wafer.

11. The method of claim 10 wherein the first structure is at least as large as a square of 1×1 mm, and the second structure is no larger than a square of 60×60 µm.

12. The method of claim 10 wherein the conductive material forms a plurality of conductive lines in each of the first and second structures, wherein the width of each conductive line and the distance between the adjacent conductive lines are the same in the first and second structures, and wherein at the location of the second structure the wafer does not have any layers not present in the first structure.

13. The method of claim 10 wherein the conductive material comprises metal.

14. The method of claim 10 wherein the conductive material comprises copper or tungsten.

15. A method for fabricating an integrated circuit or circuits in a wafer, the method comprising polishing the wafer, wherein the wafer comprises (i) a semiconductor substrate, (ii) a dielectric formed over the semiconductor substrate, the dielectric having a plurality of trenches therein, and (iii) a conductive material formed on the dielectric and in the trenches;

wherein the polishing operation comprises polishing the conductive material to remove the conductive material from the top surface of the dielectric;

wherein the dielectric and the conductive material in the trenches form a first structure and a second structure spaced from the first structure, wherein each of the first and second structures have the same distance between corresponding points of adjacent trenches, wherein the first structure is adjoined on at least two opposite sides by first regions which do not have said conductive material or in which said conductive material has a lower density than in the first structure, and the second structure is adjoined on at least two opposite sides by second regions which do not have said conductive material or in which said conductive material has a lower density than in the second structure, wherein the second regions are disjoint from the first regions or overlap the first regions;

wherein the second structure is smaller in size than the first structure;

wherein the second structure overlaps a scribe line or a margin area of the wafer; and wherein at the location of the second structure the wafer does not have any layers not present in the first structure.

16. The method of claim 15 wherein the conductive material comprises metal.

17. The method of claim 15 wherein the conductive material comprises copper or tungsten.

18. The method of claim 16 wherein the conductive material forms a plurality of conductive lines in each of the first and second structures, wherein the width of each conductive line and the distance between the adjacent conductive lines are the same in the first and second structures.

* * * * *